(12) United States Patent
Yu et al.

(10) Patent No.: US 10,096,767 B2
(45) Date of Patent: Oct. 9, 2018

(54) ELONGATED MAGNETORESISTIVE TUNNEL JUNCTION STRUCTURE

(71) Applicant: Taiwan Semiconductor Manufacturing Company, Ltd., Hsin-Chu (TW)

(72) Inventors: Chwen Yu, Taipei (TW); Kai-Wen Cheng, Taichung (TW); Tien-Wei Chiang, Taipei (TW); Dong Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/791,983

(22) Filed: Mar. 9, 2013

(65) Prior Publication Data

US 2014/0252513 A1  Sep. 11, 2014

(51) Int. Cl.
| | | |
|---|---|---|
| *H01L 29/82* | (2006.01) |
| *H01L 43/02* | (2006.01) |
| *G11B 5/39* | (2006.01) |
| *H01L 43/12* | (2006.01) |
| *H01L 43/08* | (2006.01) |

(Continued)

(52) U.S. Cl.
CPC .......... *H01L 43/02* (2013.01); *G11B 5/3909* (2013.01); *G11C 11/161* (2013.01); *H01L 27/222* (2013.01); *H01L 43/08* (2013.01); *H01L 43/12* (2013.01)

(58) Field of Classification Search
CPC ....... H01L 29/82; H01L 27/222; H01L 41/12; H01L 41/20; H01L 43/02; H01L 43/12; G11C 11/14; G11C 11/15; G11C 11/161; G11B 2005/2996; G11B 5/39;
(Continued)

(56) References Cited

U.S. PATENT DOCUMENTS

| | | | | |
|---|---|---|---|---|
| 652,764 | A | * | 7/1900 | Abraham et al. ................. 63/22 |
| 6,452,764 | B1 | * | 9/2002 | Abraham ............... B82Y 10/00 |
| | | | | 257/E21.665 |

(Continued)

FOREIGN PATENT DOCUMENTS

| | | |
|---|---|---|
| DE | 19843349 A1 | 3/2000 |
| DE | 10014780 A1 | 10/2001 |

(Continued)

OTHER PUBLICATIONS

K.W. Cheng et al., "Compensation Between Magnetoresistance and Switching Current in Co/Cu/Co Spin Valve Pillar Structure," Applied Physics Letters 96, 2010 American Institute of Physics, 2010, 3 pages.

(Continued)

*Primary Examiner* — Eric Ward
*Assistant Examiner* — Eric Ashbahian
(74) *Attorney, Agent, or Firm* — Haynes and Boone, LLP

(57) ABSTRACT

A Magnetoresistive Tunnel Junction (MTJ) device includes an elongated MTJ structure formed onto a substrate, the MTJ structure including a magnetic reference layer and a tunnel barrier layer. The MTJ device also includes a number of discrete free magnetic regions disposed onto the tunnel barrier layer. The ratio of length to width of the elongated MTJ structure is such that the magnetic field of the magnetic reference layer is pinned in a single direction.

20 Claims, 6 Drawing Sheets

(51) Int. Cl.
*H01L 27/22* (2006.01)
*G11C 11/16* (2006.01)

(58) Field of Classification Search
CPC ... G11B 5/3909; G11B 5/7325; H01F 10/329; G01R 33/098; H03B 15/006
USPC .............. 257/421, E21.665; 365/158, 171; 427/123; 428/811.1
See application file for complete search history.

(56) References Cited

U.S. PATENT DOCUMENTS

| | | | |
|---|---|---|---|
| 6,656,372 B2 | 12/2003 | Yates | |
| 6,765,823 B1* | 7/2004 | Zhu et al. | 365/173 |
| 6,845,038 B1* | 1/2005 | Shukh | 365/171 |
| 7,902,579 B2* | 3/2011 | Lim et al. | 257/295 |
| 8,278,122 B2* | 10/2012 | Lu | H01L 43/12 257/E21.663 |
| 2001/0085808 | 5/2004 | Anthony et al. | |
| 2004/0115478 A1 | 6/2004 | Qian et al. | |
| 2004/0179395 A1 | 9/2004 | Tsang | |
| 2005/0047241 A1* | 3/2005 | Min | G11C 11/16 365/222 |
| 2006/0002184 A1* | 1/2006 | Hong | B82Y 10/00 365/171 |
| 2006/0120147 A1* | 6/2006 | Peng et al. | 365/158 |
| 2009/0256220 A1* | 10/2009 | Horng et al. | 257/421 |
| 2009/0261434 A1* | 10/2009 | Kang et al. | 257/421 |
| 2011/0069541 A1* | 3/2011 | Ono et al. | 365/171 |
| 2011/0149649 A1* | 6/2011 | Hwang | G11C 11/15 365/173 |
| 2012/0193736 A1 | 8/2012 | Mather et al. | |
| 2012/0300540 A1 | 11/2012 | Liu et al. | |
| 2013/0126996 A1* | 5/2013 | Jeong | 257/421 |
| 2013/0187247 A1* | 7/2013 | Wu et al. | 257/421 |
| 2013/0201757 A1* | 8/2013 | Li et al. | 365/171 |
| 2013/0300540 A1* | 11/2013 | Hadley et al. | 340/10.1 |

FOREIGN PATENT DOCUMENTS

| | | |
|---|---|---|
| DE | 10255327 A1 | 6/2004 |
| DE | 10327390 A1 | 1/2005 |
| JP | 2004153268 A | 5/2004 |

OTHER PUBLICATIONS

German Patent Office, Office Acton dated Mar. 3, 2014, Application No. 102013107074.4. 12 pages.

Office Action dated Apr. 5, 2016 in Chinese Application No. 201310231336.4.

* cited by examiner

ELONGATED MAGNETORESISTIVE TUNNEL JUNCTION STRUCTURE

BACKGROUND

A Magnetoresistive Tunnel Junction (MTJ) is a device that changes its resistive state based on the state of magnetic materials within the device. An MTJ device includes a thin resistive layer between two ferromagnetic layers. One magnetic layer may be referred to as the reference layer. The other magnetic layer may be referred to as the free layer. The magnetic moment of the reference layer generally maintains the same direction. Conversely, through application of a voltage across the junction, the direction of the magnetic moment of the free layer can be reversed. When the direction of the magnetic moment of both the free layer and the reference layer are the same, electrons can more easily tunnel through the thin resistive layer. In this state, the junction has a relatively low resistivity.

Through application of a voltage with the opposite polarity, the magnetic moment of the free layer can be switched to oppose the direction of the magnetic moment of the reference layer. In this state, it is more difficult for electrons to tunnel through the resistive layer, causing the junction to have a relatively high resistivity. The different resistive states can be used to store logical values. Improvements are desired in this field of endeavor.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
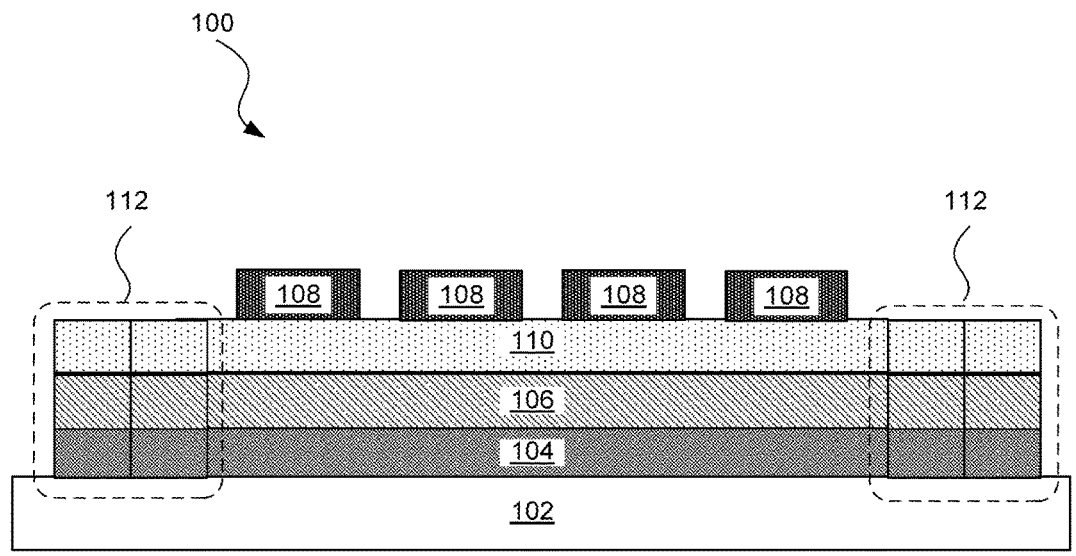
FIG. 1A is a diagram showing an illustrative cross-sectional view of an elongated MTJ structure, according to one example of principles described herein.

FIG. 1A is a diagram showing an illustrative cross-sectional view of an elongated MTJ structure 100. The MTJ structure 100, which is formed onto a substrate 102, includes a buffer layer 104, a magnetic reference layer 106, a tunnel barrier layer 110, and a free magnetic layer that includes a number of discrete free magnetic regions 108. Each free magnetic region 108 is used for a different MTJ memory cell.

The substrate 102 may be made of a semiconductor material such as silicon. The substrate 102 may be used to support a number of components in addition to the elongated MTJ structure 100. The buffer layer 104 is formed onto the substrate 102 in order to assist in the process of forming the magnetic reference layer 106, which may be done using epitaxial processes. The magnetic reference layer 106 may be made of a variety of materials, including, but not limited to, CoFeB, CoFeTa, NiFe, Co, CoFe, CoPt, CoPd, FePt, or other alloys of Ni, Co and Fe.

Traditional MTJ structures have a reference layer that includes both a pinning layer and a pinned layer. The pinning layer is a layer of anti-ferromagnetic (AFM) material. Anti-ferromagnetic materials are those in which the magnetic moments of atoms or molecules align such that a pattern is formed wherein neighboring atoms or molecules have spins pointing in opposite directions. The pinned layer includes a ferromagnetic layer having a magnetic moment that is "pinned" in a particular direction by the anti-ferromagnetic pinning layer. Thus, the reference layer does not change its magnetic moment during operation of the MTJ device.

Using an elongated magnetic reference layer, however, there is no need for the anti-ferromagnetic pinning layer. This is because the elongated nature of the magnetic reference layer 106 serves as a pinning mechanism to pin the magnetic moment of the magnetic reference layer 106 in a single direction. By using the elongated nature, the direction of magnetic moment can be set along the entire elongated structure when applying a magnetic field along the elongated direction. In some examples, the elongated structure may have a length to width ratio of at least 30.

Figure 2A:
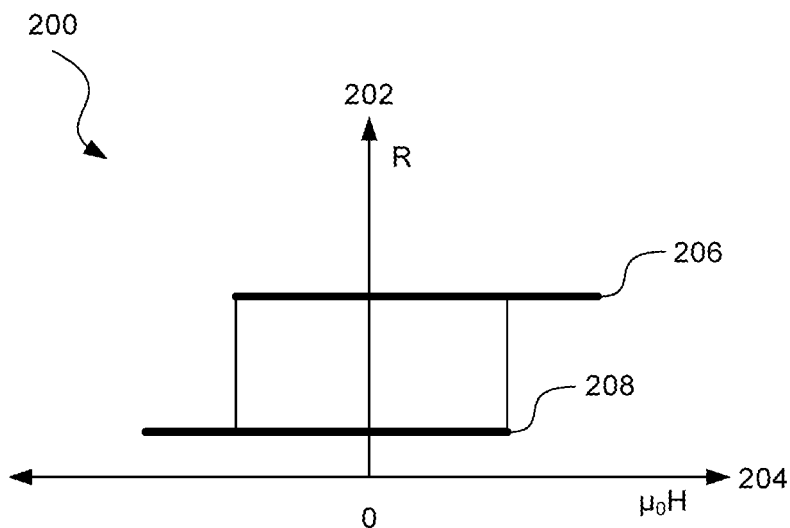
FIG. 2A is a diagram showing an illustrative good hysteresis loop for an MTJ device, according to one example of principles described herein.
Figure 2B:
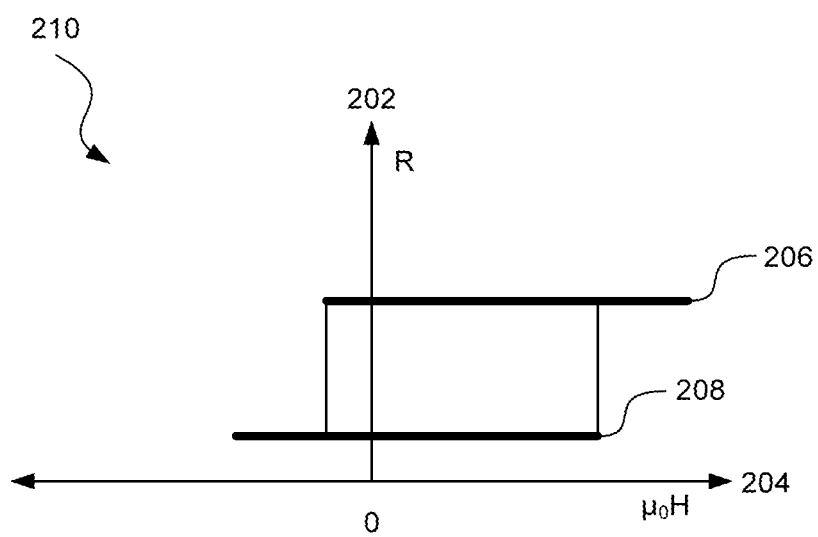
FIG. 2B is a diagram showing an illustrative bad hysteresis loop for an MTJ device, according to one example of principles described herein.

Traditional MTJ structures have a discrete reference layer for each discrete free layer. These discrete reference layers generate stray fields from the edges edge which affect the free layer. This causes a bad hysteresis loop as shown in FIG. 2B. However, using an elongated magnetic reference layer 106, instead of discrete reference layers, the stray field is effectively diminished, and the free magnetic layer 108 is not adversely affected by stray magnetic fields. Thus, the hysteresis loop becomes better as shown in FIG. 2A.

The tunnel barrier layer 110 may be formed of an electrically resistive material, such as an oxide material. For example, the tunnel barrier layer 106 may be made magnesium (Mg), magnesium oxide (MgO), aluminum oxide (AlO), aluminum nitride (AlN), and aluminum oxynitride (AlON). The tunnel barrier layer 106 may be formed through suitable deposition methods.

The free layer 108 is also made of a ferromagnetic material. Unlike the reference layer 104, the magnetic moment direction of the free layer can change under various conditions during operation of the MTJ device structure because there is no pinning mechanism associated with the free layer. When the magnetic moment of a free magnetic region 108 is the same direction as the magnetic moment of the reference layer 104, electrons can tunnel through the tunnel barrier layer 110. This causes the region of the tunnel barrier layer 110 between that free magnetic region 108 and the reference layer 106 to be in a relatively low resistive state. Thus, with a properly polarized voltage applied, an electric current can flow through.

With an oppositely polarized voltage applied, the direction of the magnetic moment of a free magnetic region 108 can be set to oppose the direction of the magnetic moment of the reference layer 106. In this state, it is more difficult for electrons to tunnel through the tunnel barrier layer 110. This causes the region of the tunnel barrier layer 110 between that free magnetic region 108 and the reference layer to be in a relatively high resistive state. The different resistive states may be used to represent digital values. For example, the high resistive state may be used to represent a digital '0' while the low resistive state may be used to represent a digital '1'.

In addition to having an elongated nature, the MTJ structure may include reservoir regions 112 at one or both ends. The reservoir region 112 makes the magnetic moment circular, so that there is no stray field generated from both ends of the elongated strip 106. Thus, the free magnetic layers 108 near the reservoir regions 112 are not affected by the stray field.

In one example, the elongated structure may be formed by depositing a general buffer layer 104, a general magnetic reference layer 106, and a general tunnel barrier layer. A photo-resist material may then be applied to the tunnel barrier layer. The photo-resist material may then be exposed to a light source through a photo-mask. The photo-mask may be patterned so that when the photo-resist is developed, it will cover regions of the tunnel barrier layer 110 in the shape of the elongated structure or structures. The remaining exposed regions can then be etched away. Specifically, the etching can extend through the tunnel barrier layer 110, the magnetic reference layer 106, and the buffer layer 104 down to the substrate. The free magnetic regions 108 may then be deposited on top of the tunnel barrier layer of the elongated structures. Other methods may be used to form the structure described above and illustrated in FIG. 1A.

Figure 1B:
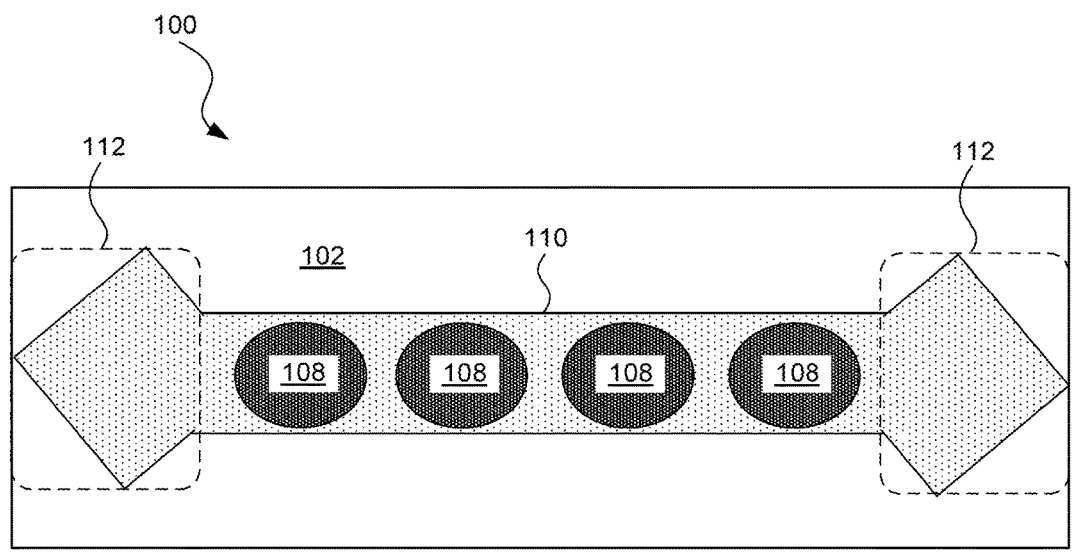
FIG. 1B is a diagram showing an illustrative top view of an elongated MTJ structure, according to one example of principles described herein.

FIG. 1B is a diagram showing an illustrative top view of an elongated MTJ structure 100. In this example, the reservoir regions are illustrated as a diamond shape. Additionally, the free magnetic regions 118 are elliptical shaped. According to certain illustrative examples, the free magnetic regions 108 are such that the length is greater than the width. For example, the length to width ratio of the free magnetic regions 108 may range from about 1 to 4. This helps the magnetic reference layers to have a good hysteresis loop.

Hysteresis is the property of a system in which the output is affected both by the present input and past conditions. If an input to such a system alternately increases and decreases, then the output tends to form a loop. MTJ devices exhibit hysteresis due to the ferromagnetic materials within. Thus, as the voltage across the junction alternates between positive and negative voltages, the output presents as a loop.

FIG. 2A is a diagram showing an illustrative good hysteresis loop 200 for an MTJ device. According to certain illustrative examples, the vertical axis represents resistance while the horizontal axis 204 represents the magnetic moment of a free magnetic region. The loop has both a high resistive state 206, and a low resistive state 208. When the direction of the magnetic moment is negative (opposite the direction of the magnetic moment of the reference layer), then the device will be in a high resistive state 206. The device will remain as such until an applied voltage reverses the direction (to be in parallel to the direction of the magnetic moment of the reference layer), making it positive enough to allow tunneling of electrons, thereby causing a low resistive state 208. The device will also remain in that state until an applied voltage reverses the direction of the magnetic moment enough to inhibit the tunneling of electrons and switch the device back to the high resistive state 206.

FIG. 2B is a diagram showing an illustrative bad hysteresis loop 210 for an MTJ structure. As mentioned above, the dipole interaction between the free magnetic layer and the magnetic reference layer can adversely affect the hysteresis loop. Particularly, a hysteresis loop that is not centered on zero is a bad hysteresis loop. The bad hysteresis loop adversely affects the switching characteristics of the MTJ device.

Figure 3A:
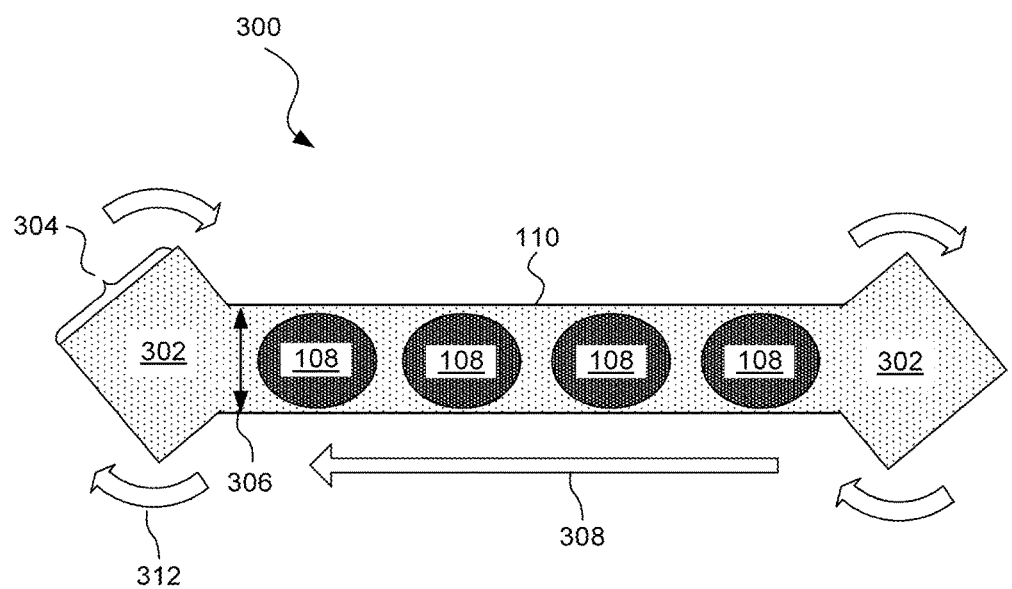
FIG. 3A is a diagram showing an illustrative top view of an elongated MTJ structure having diamond shaped reservoir regions, according to one example of principles described herein.

FIG. 3A is a diagram showing an illustrative top view of an elongated MTJ structure having diamond shaped reservoir regions. In this example, the diamond shape is a square shape with edges at a 45 degree angle from the elongated structure 100. According to certain illustrative examples, the length 304 of the edges of the diamond-shaped reservoir regions 302 can be about 1.25 times the width 306 of the elongated structure.

As mentioned above, the reservoir regions help the setting process to pin the magnetic moment of the elongated reference layer. In this example, a magnetic field is applied to one or both of the reservoir regions 302. This magnetic field is in a clockwise direction 312 when viewed from the top. This causes the magnetic moment of the elongated magnetic reference layer to be in a direction 308 that points to the left. The free regions 108 that are also directed to the left, in parallel with the reference layer will be in a low resistive state. Conversely, the free regions 108 that are pointed in the opposite direction will be in a high resistive state.

Figure 3B:
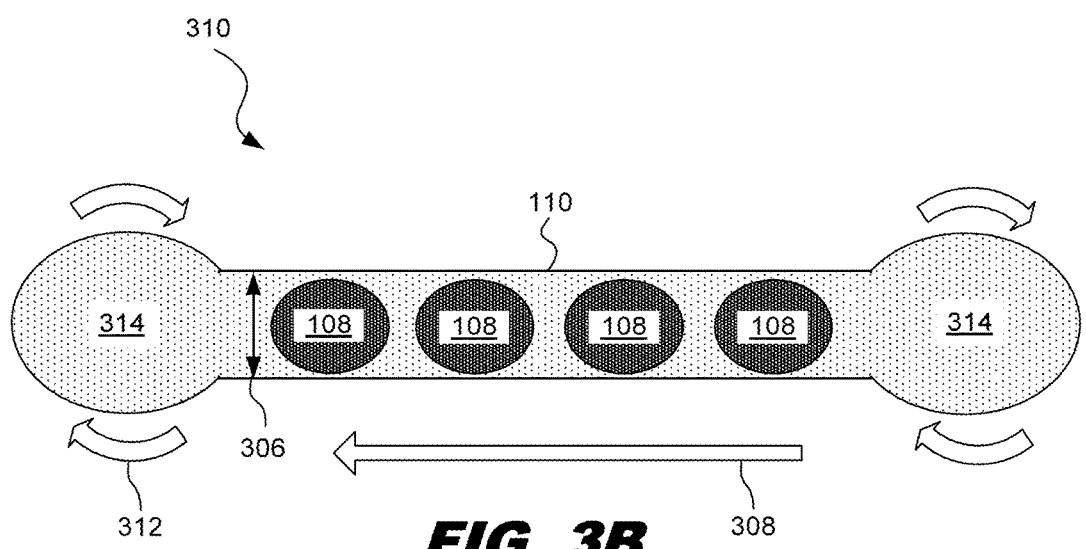
FIG. 3B is a diagram showing an illustrative top view of an elongated MTJ structure having elliptical shaped reservoir regions, according to one example of principles described herein.

FIG. 3B is a diagram showing an illustrative top view of an elongated MTJ structure having elliptical shaped reservoir regions 312. Such reservoir regions 312 may perform similarly to the reservoir regions 302 illustrated in FIG. 3A. Specifically, a clockwise magnetic field 312 causes the elongated magnetic reference layer to have a magnetic moment pointed towards the left when viewed from the top. The reservoir regions may be shaped in a variety of shapes. For example, various polygonal, circular, or elliptical shapes may be used.

Figure 4A:
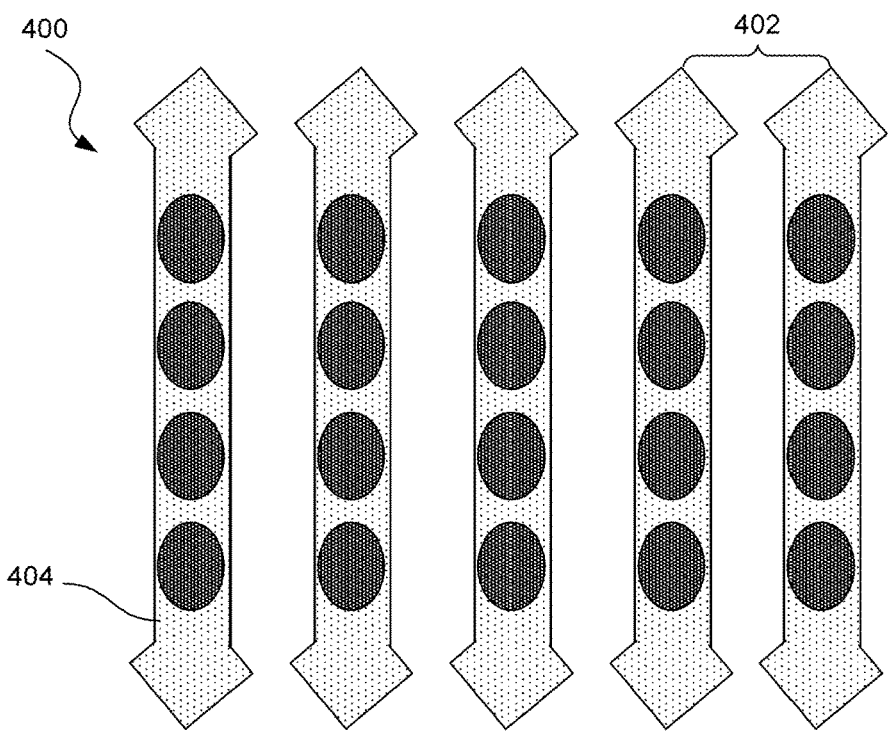
FIG. 4A is a diagram showing an illustrative top view of an aligned elongated MTJ array, according to one example of principles described herein.

FIG. 4A is a diagram showing an illustrative top view of an aligned elongated MTJ array 400. According to certain illustrative examples, a memory array may be fabricated by forming a number of lines 404 in a row. Each line 404 corresponds to an elongated structure as illustrated in FIGS. 1A and 1B. In this example, line is aligned with adjacent lines. Each line is at a specified distance 402 from adjacent lines. This distance 402 may be set with consideration of a variety of factors, including patterning limitations and crosstalk issues between two adjacent lines.

Figure 4B:
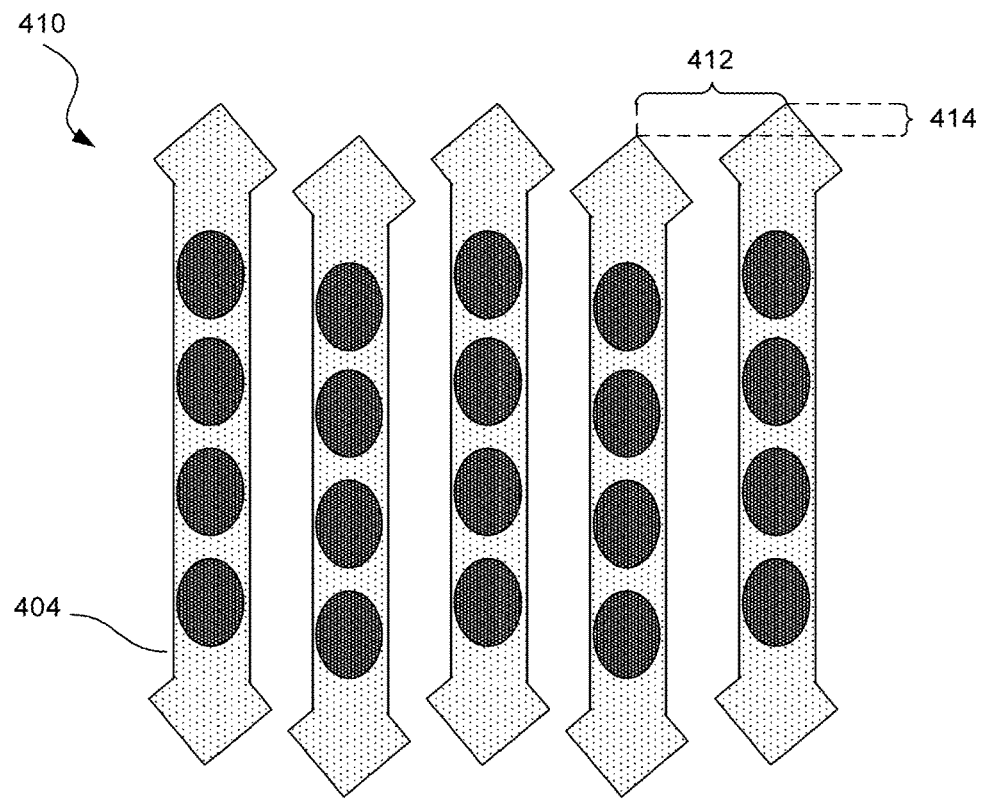
FIG. 4B is a diagram showing an illustrative top view of an offset elongated MTJ array, according to one example of principles described herein.

FIG. 4B is a diagram showing an illustrative top view of an offset elongated MTJ array 410. According to certain illustrative examples, each of the lines 404 may be offset from adjacent lines. This offset may be patterned. Specifically, every other line 404 may be offset by a certain distance 414. This may allow the distance 412 between lines to be reduced, allowing for an overall higher density array. Additionally, because the reservoir regions are offset, there may be less crosstalk between adjacent reservoir regions.

Figure 5:
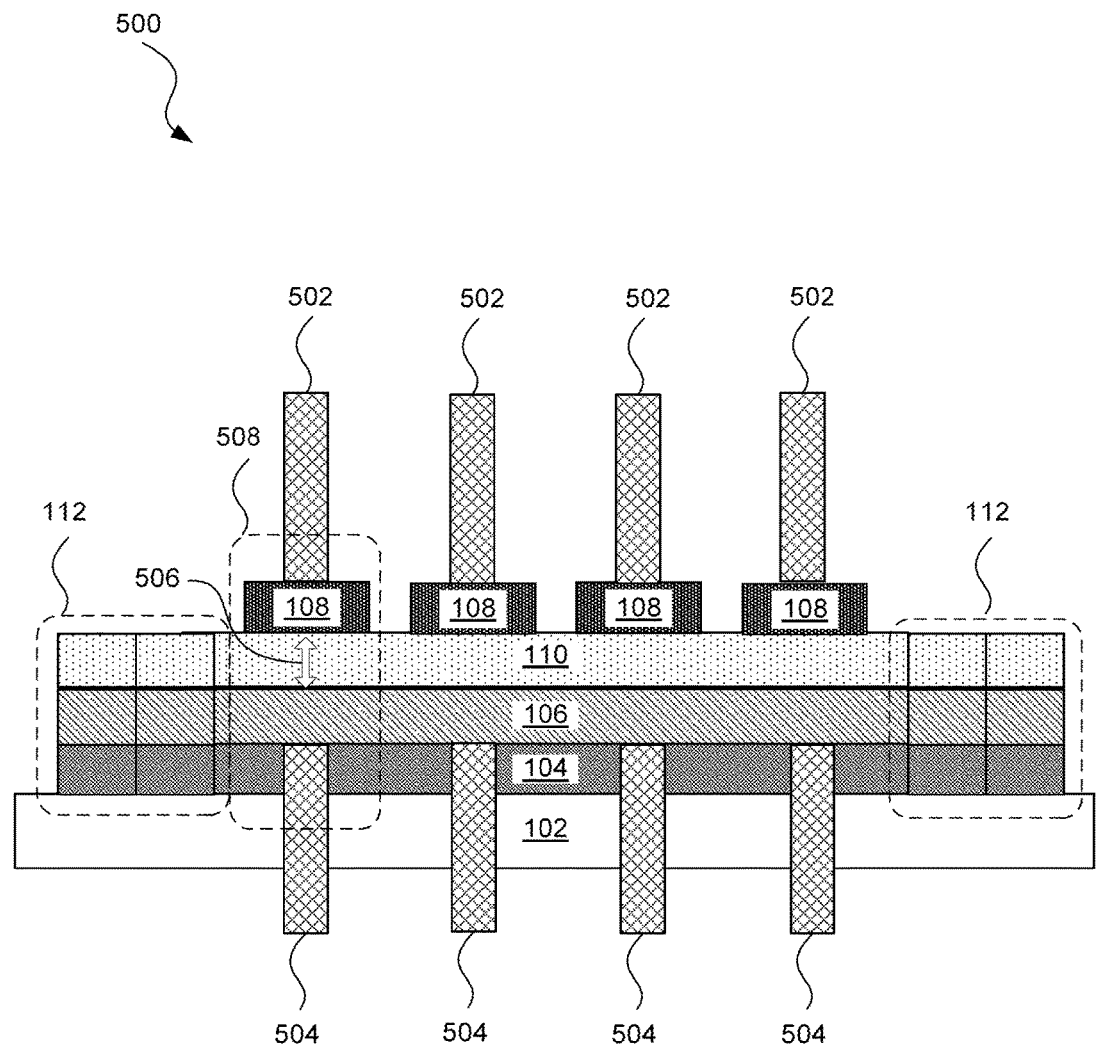
FIG. 5 is a diagram showing an illustrative cross-sectional view of an elongated MTJ structure that includes top and bottom contacts, according to one example of principles described herein.

FIG. 5 is a diagram showing an illustrative cross-sectional view of an elongated MTJ structure that includes top and bottom contacts. As mentioned above, an MTJ memory cell uses the resistive state of the tunnel barrier 110 between a free magnetic region 108 and the magnetic reference layer 106 to store data. This resistive state is affected by the magnetic moment of the free magnetic region 108. The magnetic moment of the free region 108 can be changed by applying various electrical condition such as a voltage. Thus, to apply the voltage, contacts 502, 504 are formed that connect to the free magnetic regions 108 and the magnetic reference layer 106.

The top contacts 502 connect the free magnetic regions 108 to circuitry that applies the voltage required to set or read the resistive state of the tunnel barrier at specific regions. The bottom contacts are formed through the substrate 102 and the buffer layer 104 to connect to the magnetic reference layer 106. The bottom contacts 504 also connect to circuitry that applies the voltage required to set or read the resistive state of the tunnel barrier at specific regions.

The contacts 502, 504 form parts of a MTJ memory cell 508 for each free magnetic region 108. Through application of a voltage between a corresponding top contact 502 and bottom contact 504, electric current 506 can flow through the tunnel barrier if the free magnetic region 108 is in the appropriate state. While only four free magnetic regions 108 are illustrated along the elongated structure. A practical elongated structure may have a much larger number of free magnetic regions.

Figure 6:
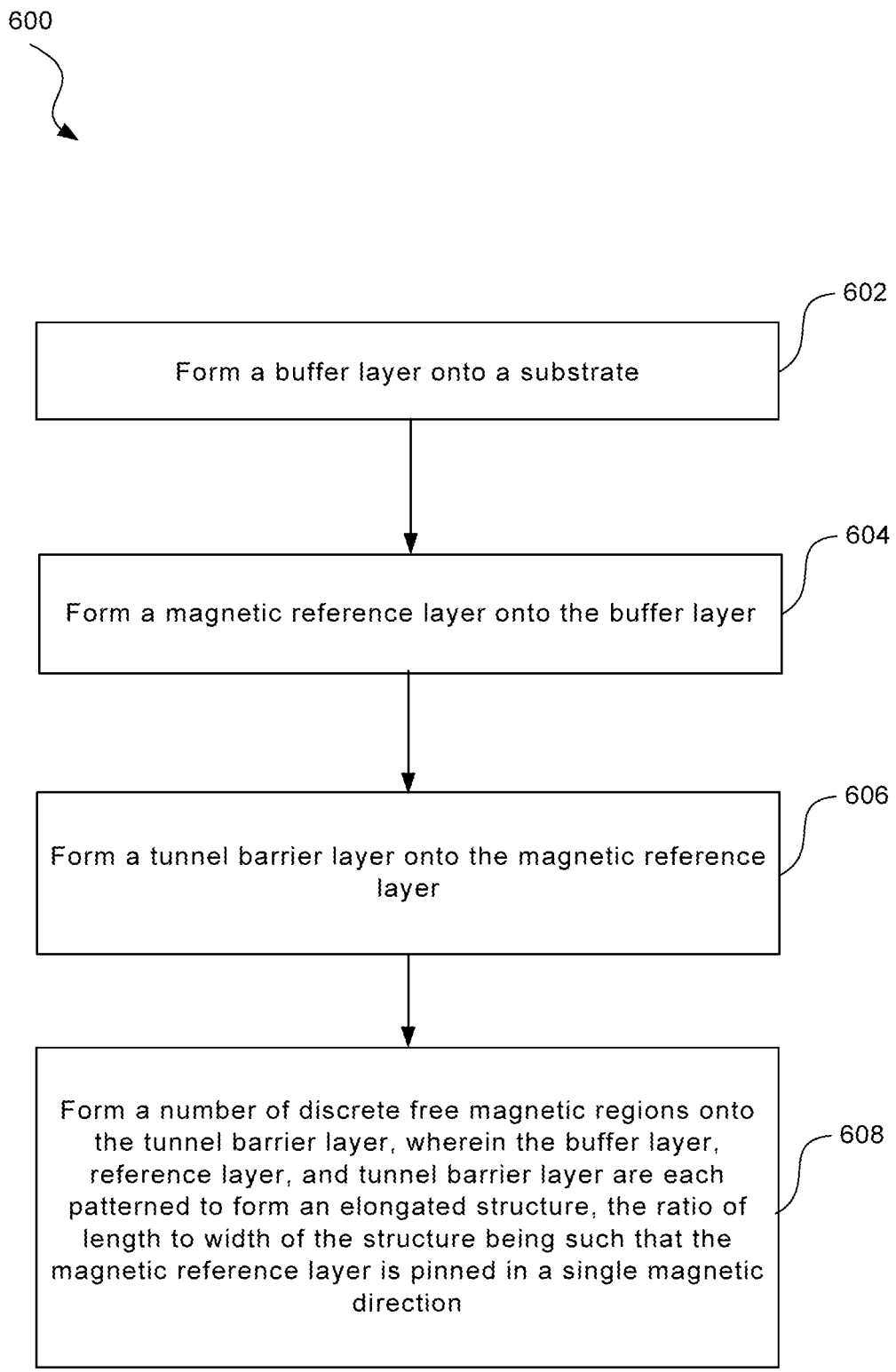
FIG. 6 is a flowchart showing an illustrative method for forming an elongated MTJ structure, according to one example of principles described herein.

FIG. 6 is a flowchart showing an illustrative method 600 for forming an elongated MTJ structure. According to certain illustrative examples, the method includes a step of forming 602 a buffer layer onto a substrate. The method further includes a step of forming 604 a magnetic reference layer onto the buffer layer. The method further includes a step of forming 606 a tunnel barrier layer onto the magnetic reference layer. The method further includes a step of forming 608 a number of discrete free magnetic regions onto the tunnel barrier layer. The buffer layer, reference layer, and tunnel barrier layer are each patterned to form an elongated structure, the ratio of length to width of the structure being such that the magnetic reference layer is pinned in a single magnetic direction.

According to certain illustrative examples, a Magnetoresistive Tunnel Junction (MTJ) device includes an elongated MTJ structure formed onto a substrate, the MTJ structure including a magnetic reference layer and a tunnel barrier layer. The MTJ device also includes a number of discrete free magnetic regions disposed onto the tunnel barrier layer. The ratio of length to width of the elongated MTJ structure is such that the magnetic field of the magnetic reference layer is pinned in a single direction.

According to certain illustrative examples, a Magnetic Tunnel Junction (MTJ) memory array includes a number of elongated lines formed onto a substrate. Each line includes a magnetic reference layer, a tunnel barrier layer, and a number of separate free magnetic regions formed along the tunnel barrier layer, each free magnetic region forming a memory cell. The ratio of length to width of the elongated MTJ structure is such that the magnetic field of the magnetic reference layer is pinned in a single direction.

A method for forming a Magnetoresistive Tunnel Junction (MTJ) device includes forming a buffer layer onto a substrate, forming a magnetic reference layer onto the buffer layer, forming a tunnel barrier layer onto the magnetic reference layer, and forming a number of discrete free magnetic regions onto the tunnel barrier layer. The buffer layer, reference layer, and tunnel barrier layer are each patterned to form an elongated structure, the ratio of length to width of the structure being such that the magnetic reference layer is pinned in a single magnetic direction.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A Magnetoresistive Tunnel Junction (MTJ) device comprising:
   an elongated MTJ structure formed onto a semiconductor substrate, the MTJ structure comprising:

a buffer layer disposed directly on the semiconductor substrate such that the buffer layer physically contacts the semiconductor substrate;

a magnetic reference layer disposed over the buffer layer and extending across the entire length of the elongated MTJ structure;

a tunnel barrier layer disposed over the magnetic reference layer; and a number of discrete free magnetic regions disposed onto the tunnel barrier layer, wherein one of the discrete free magnetic regions has a top surface facing away from the tunnel barrier layer; and a top contact physically contacting the one of the discrete free magnetic regions such that a first portion of the top surface of the one of the discrete free magnetic regions is covered by the top contact and a second portion of the top surface of the one of the discrete free magnetic regions is not covered by the top contact, and wherein a ratio of length to width of the elongated MTJ structure is such that the magnetic field of the magnetic reference layer is pinned in a single direction across the entire length of the MTJ structure, wherein the MTJ device is without an anti-ferromagnetic pinning layer, wherein the buffer layer has a profile shape in a top view of the elongated MTJ structure, and wherein the tunnel barrier layer has the profile shape in the top view of the elongated MTJ structure, and wherein the elongated MTJ structure includes opposing ends disposed on either side of an elongated body of the elongated MTJ structure, the opposing ends each including a reservoir region having a greater width than the elongated body, the reservoir regions being free of any free magnetic material layer and configured to make magnetic moment circular.

2. The device of claim 1, wherein the ratio of length to width of the elongated MTJ structure is at least 30.

3. The device of claim 1, wherein the reservoir regions are a diamond shape.

4. The device of claim 3, wherein edges of the diamond shaped reservoir regions are about 1.25 times the width of the elongated structure.

5. The device of claim 1, wherein the reservoir regions are elliptically shaped.

6. The device of claim 1, wherein the ratio of length to width of the free magnetic regions is not less than one, the length being parallel to the elongated length of the elongated structure.

7. The device of claim 1, further comprising a number of top contacts, each top contact connecting to one of the free magnetic regions.

8. The device of claim 7, further comprising a number of bottom contacts formed through the semiconductor substrate and the buffer layer to the magnetic reference layer, each bottom contact positioned beneath one of the discrete free magnetic regions so as to form a MTJ cell.

9. A Magnetic Tunnel Junction (MTJ) memory array, the memory array comprising:

a number of elongated MTJ line structures formed onto a substrate, each elongate MTJ line structure comprising:

a magnetic reference layer extending across the entire length of each elongated MTJ structure;

a tunnel barrier layer; and a number of separate free magnetic regions formed along the tunnel barrier layer, each free magnetic region forming a memory cell, wherein one of the separate free magnetic regions has a top surface facing away from the tunnel barrier layer;

wherein a ratio of length to width of each elongated MTJ line structure is such that the magnetic field of the magnetic reference layer is pinned in a single direction across the entire length of each elongated MTJ line structure, and wherein one of the elongated line structures is free of an anti-ferromagnetic pinning layer, wherein the one of the elongated MTJ line structures includes a patterned buffer layer physically contacting the semiconductor substrate, wherein the patterned buffer layer has a profile shape in a top view of the elongated MTJ structure, and wherein the tunnel barrier layer of the one of the elongated MJT line structures is a patterned tunnel barrier layer having the profile shape in the top view of the elongated MTJ structure, and wherein a contact physically contacting the one of the separate free magnetic regions such that a first portion of the top surface of the one of the separate free magnetic regions is covered by the contact and a second portion of the top surface of the one of the separate free magnetic regions is not covered by the contact, and wherein opposing ends of the one of the elongated MTJ line structures includes reservoir regions, the reservoir regions having a greater width than the width of the one of the elongated MTJ line structures, the reservoir regions being free of any free magnetic material layer and configured to make magnetic moment circular.

10. The array of claim 9, wherein the ratio of length to width of the one of the elongated MTJ line structures is at least 30.

11. The array of claim 9, wherein the reservoir regions are a diamond shape or a polygon shape.

12. The array of claim 9, wherein the reservoir regions are elliptically shaped.

13. The array of claim 9, wherein each of the elongated MTJ line structures is aligned with adjacent elongated MTJ line structures.

14. The array of claim 9, wherein each of the elongated MTJ line structures is offset from adjacent elongated MTJ line structures.

15. A device comprising:

an MTJ structure disposed over a semiconductor substrate, the MTJ structure comprising:

a buffer layer disposed directly on the semiconductor substrate such that the buffer layer physically contacts the semiconductor substrate;

a magnetic reference layer disposed directly on the buffer layer such that the magnetic reference layer physically contacts the buffer layer and extends across the entire length of the MTJ structure;

a tunnel barrier layer disposed directly on the magnetic reference layer such that the tunnel barrier layer physically contacts the magnetic reference layer; and a free magnetic region disposed directly on the tunnel barrier layer such that the free magnetic region physically contacts the tunnel barrier layer; and a contact extending through the semiconductor substrate and the buffer layer to the magnetic reference layer, and wherein the MTJ structure is without an anti-ferromagnetic pinning layer, and wherein the MTJ structure includes opposing ends disposed on either side of an elongated body of the MTJ structure, the opposing ends each including a reservoir region having a greater width than the elongated body, the reservoir regions being free of any free magnetic regions and configured to make magnetic moment circular, and wherein a ratio of length to width of the MTJ structure is such that the magnetic field of the magnetic reference layer is pinned in a single direction across the entire length of the MTJ structure.

16. The device of claim 15, wherein the free magnetic region includes a number of free magnetic regions that are spaced apart from each other.

17. The device of claim 15, wherein the contact extends through and beyond a first side of the semiconductor substrate and extends through and beyond a second side of the semiconductor substrate, wherein the first side of the semiconductor substrate opposes the second side of the semiconductor substrate.

18. The device of claim 15, wherein the free magnetic region includes a first free magnetic region and a second free magnetic region that are spaced apart from each other, and wherein a contact physically contacting the first free magnetic region such that a first portion of a top surface of the first free magnetic region is covered by the contact and a second portion of the top surface of the first free magnetic region is not covered by the contact, wherein the top surface of the first free magnetic region faces away from the semiconductor substrate.

19. The device of claim 15, wherein the elongated body includes the buffer layer, the magnetic reference layer, the tunnel barrier layer, and the free magnetic region.

20. The device of claim 15, wherein the reservoir regions are a diamond shape.

* * * * *